United States Patent
Yoon et al.

(10) Patent No.: US 9,655,247 B1
(45) Date of Patent: May 16, 2017

(54) COIL COMPONENT AND BOARD HAVING THE SAME

(71) Applicant: SAMSUNG ELECTRO-MECHANICS CO., LTD., Suwon-si, Gyeonggi-do (KR)

(72) Inventors: Chan Yoon, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/258,382

(22) Filed: Sep. 7, 2016

(30) Foreign Application Priority Data

Nov. 19, 2015 (KR) .................... 10-2015-0162379

(51) Int. Cl.
| | |
|---|---|
| *H05K 1/11* | (2006.01) |
| *H05K 3/46* | (2006.01) |
| *H05K 1/18* | (2006.01) |
| *H01F 27/28* | (2006.01) |
| *H01F 27/24* | (2006.01) |
| *H01F 41/04* | (2006.01) |
| *H01F 41/02* | (2006.01) |

(52) U.S. Cl.
CPC .............. *H05K 1/181* (2013.01); *H01F 27/24* (2013.01); *H01F 27/2804* (2013.01); *H01F 41/0206* (2013.01); *H01F 41/041* (2013.01); *H05K 1/111* (2013.01); *H05K 3/46* (2013.01); *H01F 2027/2809* (2013.01); *H05K 2201/1003* (2013.01)

(58) Field of Classification Search
CPC ........... H05K 1/181; H05K 1/111; H05K 3/46
See application file for complete search history.

(56) References Cited

U.S. PATENT DOCUMENTS

| 2013/0234819 A1 | 9/2013 | Yoo et al. |
| 2015/0270053 A1 | 9/2015 | Cha et al. |

FOREIGN PATENT DOCUMENTS

| JP | 11-087155 A | 3/1999 |
| JP | 2006-278479 A | 10/2006 |
| JP | 2007-067214 A | 3/2007 |
| KR | 10-2015-0035947 A | 4/2015 |
| KR | 10-2015-0108518 A | 9/2015 |
| KR | 10-1558092 B1 | 10/2015 |
| KR | 10-2015-0127490 A | 11/2015 |

OTHER PUBLICATIONS

Notice of Office Action dated Nov. 9, 2016, issued in corresponding Korean Patent Application No. 10-2015-0162379, with English language translation.

*Primary Examiner* — Jeremy C Norris
(74) *Attorney, Agent, or Firm* — McDermott Will & Emery LLP

(57) ABSTRACT

A coil component includes a main substrate; a first coil pattern disposed on a first surface of the main substrate; a first insulating layer disposed on one surface of the first coil pattern; a third coil pattern disposed on one surface of the first insulating layer and electrically connected to the first coil pattern; a second coil pattern disposed on a second surface of the main substrate opposing the first surface; a second insulating layer disposed on one surface of the second coil pattern; a fourth coil pattern disposed on one surface of the second insulating layer and electrically connected to the second coil pattern; and a magnetic body in which the first to fourth coil patterns are embedded, and a board having the same.

20 Claims, 2 Drawing Sheets

COIL COMPONENT AND BOARD HAVING THE SAME

CROSS-REFERENCE TO RELATED APPLICATION

This application claims the benefit of priority to Korean Patent Application No. 10-2015-0162379, filed on Nov. 19, 2015 with the Korean Intellectual Property Office, the entirety of which is incorporated herein by reference.

BACKGROUND

The present disclosure relates to a coil component and a board having the same.

An inductor, which is a type of coil component, is a representative passive element forming an electronic circuit together with a resistor and a capacitor to remove noise, and may be combined with the capacitor to configure a resonance circuit amplifying a signal in a specific frequency band, a filter circuit, or the like.

Recently, there has been increased demand for thinner, miniaturized coil components. Among coil components, a chip type power inductor is mainly used in a power supply circuit such as a DC-DC converter within a portable device. In accordance with the demand for thinner, miniaturized coil components, there is a need for a chip type power inductor having a compact size, a high current, low DC resistance, and the like. In order to manufacture such a chip type power inductor, an anisotropic plating technology capable of increasing an aspect ratio (AR: coil height/coil width) of a pattern and a cross-sectional area of a coil while being able to secure a size of an internal coil has been developed, and applied to a product.

However, in applying the anisotropic plating technology when the pattern having a high aspect ratio (AR) is formed, it is necessary to increase the aspect ratio of the coil to implement high performance in a limited space. It is important to consider, however, that defect risks such as abnormal growth of plating, scattering of a plating thickness, a short between coils, and the like are increased, according to the increase in the aspect ratio. Furthermore, a coil width which may be implemented to implement high capacitance is limited, and the number of turns of the coils may also not be arbitrarily increased to secure a core area.

A coil component capable of satisfying miniaturization and high capacity while solving the above-mentioned problems is demanded.

SUMMARY

An aspect of the present disclosure provides a coil component capable of increased miniaturization and high capacitance, and a board having the same.

According to an aspect of the present disclosure, a coil component includes a main substrate; a first coil pattern disposed on a first surface of the main substrate; a first insulating layer disposed on one surface of the first coil pattern; a third coil pattern disposed on one surface of the first insulating layer and electrically connected to the first coil pattern; a second coil pattern disposed on a second surface of the main substrate opposing the first surface; a second insulating layer disposed on one surface of the second coil pattern; a fourth coil pattern disposed on one surface of the second insulating layer and electrically connected to the second coil pattern; and a magnetic body in which the first to fourth coil patterns are embedded.

According to another aspect of the present disclosure, a board having a coil component includes a substrate having a plurality of electrode pads formed thereon; and the coil component installed on the substrate, wherein the coil component includes a main substrate, a first coil pattern disposed on a first surface of the main substrate, a first insulating layer disposed on one surface of the first coil pattern, a third coil pattern disposed on one surface of the first insulating layer and electrically connected to the first coil pattern, a second coil pattern disposed on a second surface of the main substrate opposing the first surface, a second insulating layer disposed on one surface of the second coil pattern, a fourth coil pattern disposed on one surface of the second insulating layer and electrically connected to the second coil pattern, and a magnetic body in which the first to fourth coil patterns are embedded.

According to another aspect of the present disclosure, a method of manufacturing a coil component comprises steps of: forming first and second coil patterns on first and second sides of a main substrate, respectively; forming first and second insulating layers on the first and second coil patterns, respectively; forming third and fourth coil patterns on the first and second insulating layers, respectively; and forming a magnetic body embedding the first to fourth coil layers. The first and third coil patterns are electrically connected to each other; and the second and fourth coil patterns are electrically connected to each other, and a thickness of the main substrate differs from thicknesses of the first and second insulating layers.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
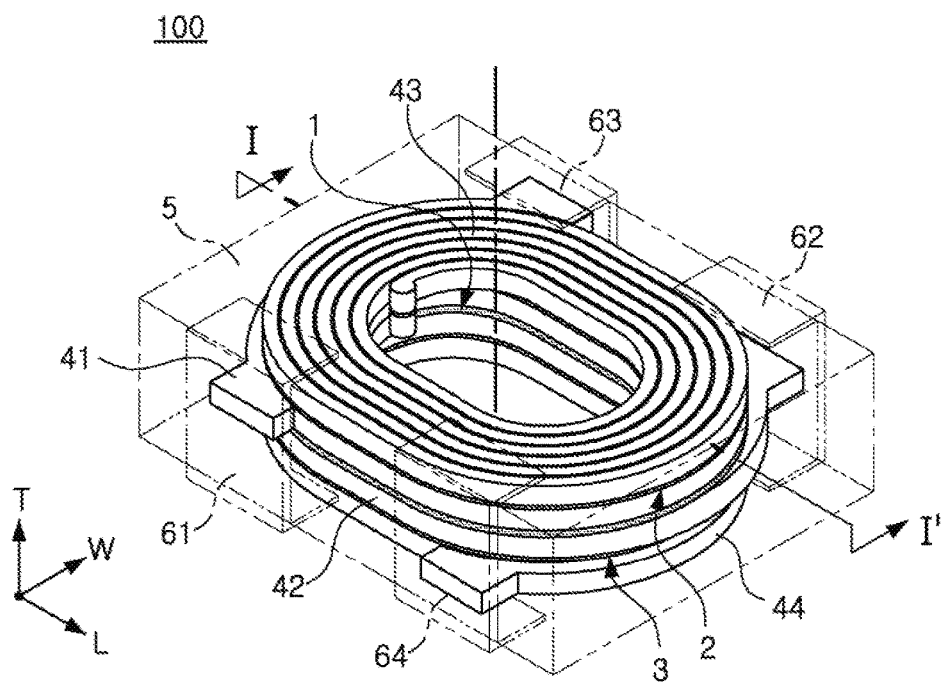
FIG. 1 is a schematic perspective view of a coil component according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Coil Component

FIG. 1 is a perspective view of a coil component according to an exemplary embodiment in the present disclosure.

In FIG. 1, a thickness direction (T-direction) may be defined as a direction in which a first insulating layer 2 disposed between first and third coil patterns 41 and 43, a main substrate 1 disposed between first and second coil patterns 41 and 42, and a second insulating layer 3 disposed between second and fourth coil patterns 42 and 44 are stacked. With the main substrate 1 as the center, a direction in which the first insulating layer 2 is disposed may be defined as an upward direction, and a direction in which the second insulating layer 3 is disposed may be defined as a downward direction.

Referring to FIG. 1, a coil component 100 according to an exemplary embodiment may include a main substrate 1, a first insulating layer 2, a second insulating layer 3, first to fourth coil patterns 41, 42, 43 and 44, and a magnetic body 5 in which the first to fourth coil patterns are embedded.

Figure 2:
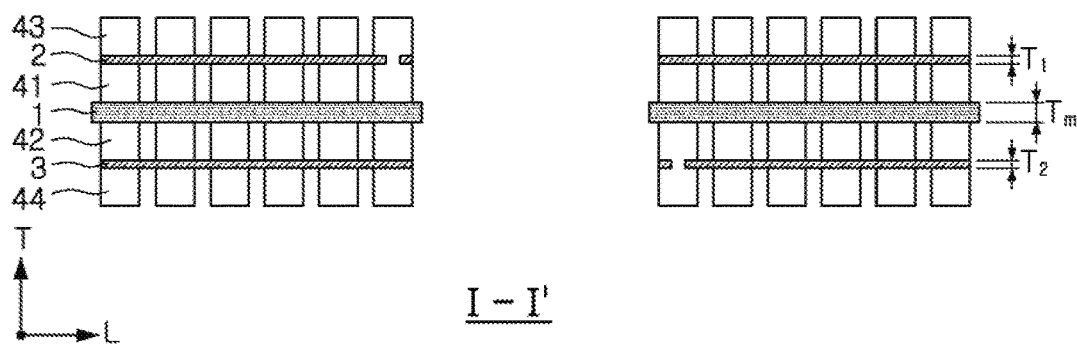
FIG. 2 is a schematic cross-sectional view taken along line I-I' of FIG. 1.

The first and third coil patterns 41 and 43 among the first to fourth coil patterns 41 to 44 may be respectively disposed on an upper surface and a lower surface of the first insulating layer 2 while having the first insulating layer 2 therebetween, and may be electrically connected to each other through a via that penetrates through the first insulating layer 2, as shown in FIG. 2.

Further, the second and fourth coil patterns 42 and 44 among the first to fourth coil patterns 41 to 44 may be respectively disposed on an upper surface and a lower surface of the second insulating layer 3 while having the second insulating layer 3 therebetween, and may be electrically connected to each other through a via that penetrates through the second insulating layer 3, as shown in FIG. 2.

Further, the first and second coil patterns 41 and 42 may be respectively disposed on an upper surface and a lower surface of the main substrate 1 while having the main substrate 1 therebetween, as shown in FIG. 2.

The first coil pattern 41 may be a pattern plating layer formed by forming a patterned plating resist on one surface of the main substrate 1 and filling an opening with a conductive metal. In a case in which electroplating is used to form the first coil pattern 41, the first coil pattern 41 may be formed as an isotropic plating layer having a shape which is simultaneously grown in a width direction W and a height direction T of the coil by adjusting current density, concentration of a plating solution, plating speed, and the like at the time of electroplating, but the present disclosure is not limited thereto.

The first insulating layer 2 may be disposed on an upper surface of the first coil pattern 41, and the third coil pattern 43 may be electrically connected to the first coil pattern 41 through the via that may be formed in the first insulating layer 2. In a case in which electroplating is used to form the third coil pattern 43, the third coil pattern 43 may be formed as an anisotropic plating layer having a shape which is grown only in the height direction T of the coil while the growth of the coil in the width direction W of the coil is suppressed, by adjusting current density, concentration of a plating solution, plating speed, and the like at the time of electroplating, but the present disclosure is not limited thereto.

Similarly, the second coil pattern 42 may be a pattern plating layer formed by forming a patterned plating resist on the other surface of the main substrate 1 and filling an opening with a conductive metal. The second coil pattern 42 may be an isotropic plating layer having a shape which is simultaneously grown in the width direction W and the height direction T of the coil, but the present disclosure is not limited thereto.

In addition, the second insulating layer 3 may be disposed on a lower surface of the second coil pattern 42, and the fourth coil pattern 44 may be electrically connected to the second coil pattern 42 through the via that may be formed in the second insulating layer 3. The fourth coil pattern 44 may be an anisotropic plating layer having a shape which is differently grown in the width direction W and the height direction T of the coil, but the present disclosure is not limited thereto.

The first and second coil patterns 41 and 42 may be formed by anisotropic plating, and the third and fourth coil patterns 43 and 44 may be formed by isotropic plating, whereby inductance of the coil may be improved while preventing abnormal growth of plating of the coil patterns 41-44 within the coil component 100.

The first to fourth coil patterns 41 to 44 may be formed of a metal having excellent electric conductivity. For example, the first to fourth coil patterns 41 to 44 may be formed of silver (Ag), palladium (Pd), aluminum (Al), nickel (Ni), titanium (Ti), gold (Au), copper (Cu), platinum (Pt), or alloys thereof.

The first coil pattern 41 may be symmetrical to the second coil pattern 42 in relation to the main substrate 1, and the third coil pattern 43 may be symmetrical to the fourth coil pattern 44 in relation to the main substrate 1, but the present disclosure is not limited thereto. Here, the terms "symmetrical" may mean that the first and the second coils 41 and 42 or the third and fourth coils 43 and 44 are disposed to be spaced apart from the upper surface and the lower surface of the main substrate 1 by the same distance while a material and a structure of the coil, an area occupied by the coil, the number of wound coils (the number of turns), and a length of the coil between the first and the second coils or between the third and fourth coils are equal to each other.

FIG. 2 is a cross-sectional view taken along line I-I' of FIG. 1.

In FIG. 2, when a thickness of the main substrate 1 interposed between the first and second coil patterns 41 and 42 is defined as $T_m$, a thickness of the first insulating layer 2 disposed on the upper surface of the first coil pattern 41 is defined as $T_1$, and a thickness of the second insulating layer 3 disposed on the lower surface of the second coil pattern 42 is defined as $T_2$, a relationship of $T_m > T_1$ and $T_m > T_2$ may be satisfied between $T_m$, $T_1$, and $T_2$.

This may mean that the thickness of the main substrate 1 positioned at the center in relation to a thickness direction of the coil component is different from the thicknesses of the first and second insulating layers 2 and 3 which are respectively positioned in an upward direction and a downward direction of the main substrate 1.

First, in order for the coil component to have hardness which is structurally bearable and not to cause process failure, a substrate having a minimum thickness of some degree or more is required. The minimum thickness of the substrate may be secured by the main substrate 1 according to the present disclosure.

Here, the phrase "cause process failure" may include, for example, an occurrence of abnormal growth of plating, an occurrence of scattering of a plating thickness, an occurrence of a short between neighboring coils, and the like, which are failures that may occur when an aspect ratio of the coil is increased to implement high performance within a limited volume.

The main substrate 1 may secure mechanical hardness of the coil component 100, and may secure enough thickness to support the first and third coil patterns 41 and 43 disposed on the upper surface thereof and the second and fourth coil patterns 42 and 44 disposed on the lower surface thereof. The thickness of the main substrate 1 may preferably be 20 μm to 80 μm, and may more preferably be 60 μm.

The main substrate 1, which is an insulating substrate, may be, for example, a printed circuit board, but is not limited thereto.

A through hole penetrating through the insulation substrate may be formed in a central portion of the main substrate 1 by performing a drilling method, a laser method, a sand blasting method, a punching process, or the like.

The first insulating layer 2 disposed on the upper surface of the first coil pattern 41 and including a via hole electrically connecting the first coil pattern 41 and the third coil pattern 43 to each other may have a thickness smaller than that of the main substrate 1. Similarly, the second insulating layer 3 disposed on the lower surface of the second coil pattern 42 and including a via hole electrically connecting the second coil pattern 42 and the fourth coil pattern 44 to each other may have a thickness smaller than that of the main substrate 1.

The first insulating layer 2 may be disposed between the first and third coil patterns 41 and 43 to serve to reliably support both of the first and third coil patterns 41 and 43 and to prevent the process failure which may be caused if the first coil pattern 41 and the third coil pattern 43 are both formed only by continuous isotropic plating, or are both formed only by continuous anisotropic plating. Similarly, the second insulating layer 2 may be disposed between the second and fourth coil patterns 42 and 44 to serve to reliably support both of the second and fourth coil patterns 42 and 44 and to prevent the process failure which may be caused if the second coil pattern 42 and the fourth coil pattern 44 are both formed only by continuous isotropic plating, or are both formed only by continuous anisotropic plating.

In other words, in order to mechanically support the coil patterns in the coil component and implement high performance within a limited space at the same time, it is necessary to increase an aspect ratio of the coil. However, since problems such as abnormal growth of plating, scattering of a plating thickness, and a short defect between the coils may occur according to the increase in the aspect ratio, the first and second insulating layers 2 and 3 may serve to alleviate the above-mentioned problems.

A combination of the first and second insulating layers 2 and 3 and the main substrate 1 according to an exemplary embodiment may maximally increase inductance that may be implemented in a situation in which an implementable coil width in implementing high capacity is limited, and the number of turns of the coil may also not be increased without being limited in order to secure a magnetic core area of the coil.

In this case, a higher inductance value may be obtained by decreasing the thicknesses of the first and second insulating layers 2 and 3 except for the thickness of the main substrate 1 positioned at the central portion in relation to the thickness direction of the coil component 100. This means that the coil component 100 has a structure in which the first and third coil patterns 41 and 43 are more tightly wound and the second and fourth coil patterns 42 and 44 are more tightly wound by decreasing the thicknesses of the first and second insulating layers 2 and 3 disposed between the coil patterns.

As the first and second insulating layers 2 and 3, for example, a polypropylene glycol (PPG) substrate, a ferrite substrate, a metal based soft magnetic substrate, or the like may be used, but the first and second insulating layers 2 and 3 are not particularly limited.

The first and second insulating layers 2 and 3 may have the same thickness $T_1$ and $T_2$, and may only need to have the thicknesses smaller than that of the main substrate 1. The thicknesses of the first and second insulating layers 2 and 3 are not particularly limited, but may be 3 μm to 20 μm.

Further, the first to fourth coil patterns 41 to 44 may be embedded in a magnetic body 5. The magnetic body 5 may determine a shape of the coil component 100 and may be formed in a hexahedral shape, but is not limited thereto.

The magnetic body 5 may be formed of any material without being limited as long as the material exhibits magnetic properties. For example, the magnetic body 5 may be formed by providing a ferrite or a metal based soft magnetic material. An example of the ferrite may include a ferrite such as a Mn—Zn based ferrite, a Ni—Zn based ferrite, a Ni—Zn—Cu based ferrite, a Mn—Mg based ferrite, a Ba based ferrite, a Li based ferrite, or the like. Further, the metal base soft magnetic material may be an alloy containing one or more selected from the group consisting of Fe, Si, Cr, Al, and Ni. For example, the metal based soft magnetic material may contain Fe—Si—B—Cr based amorphous metal particles, but is not limited thereto. The metal based soft magnetic material may have a particle diameter of 0.1 μm to 20 μm, and may be contained to be dispersed on a polymer such as an epoxy resin, polyimide, or the like.

First to fourth external electrodes 61, 62, 63 and 64 may be disposed on an outer surface of the magnetic body 5.

The first external electrode 61 may be electrically connected to one end portion of the first coil pattern 41, and the third external electrode 63 may be electrically connected to one end portion of the third coil pattern 43. Similarly, the second external electrode 62 may be electrically connected to one end portion of the second coil pattern 42, and the fourth external electrode 64 may be electrically connected to one end portion of the fourth coil pattern 44. Here, the first and second external electrodes 61 and 62 may be input terminals, and the third and fourth external electrodes 63 and 64 may be output terminals.

The first to fourth external electrodes 61, 62, 63 and 64 may be formed of a metal having excellent electrical conductivity, and may be formed of, for example, one of copper (Cu), silver (Ag), nickel (Ni), and tin (Sn), or alloys thereof.

Board Having Coil Component

Figure 3:
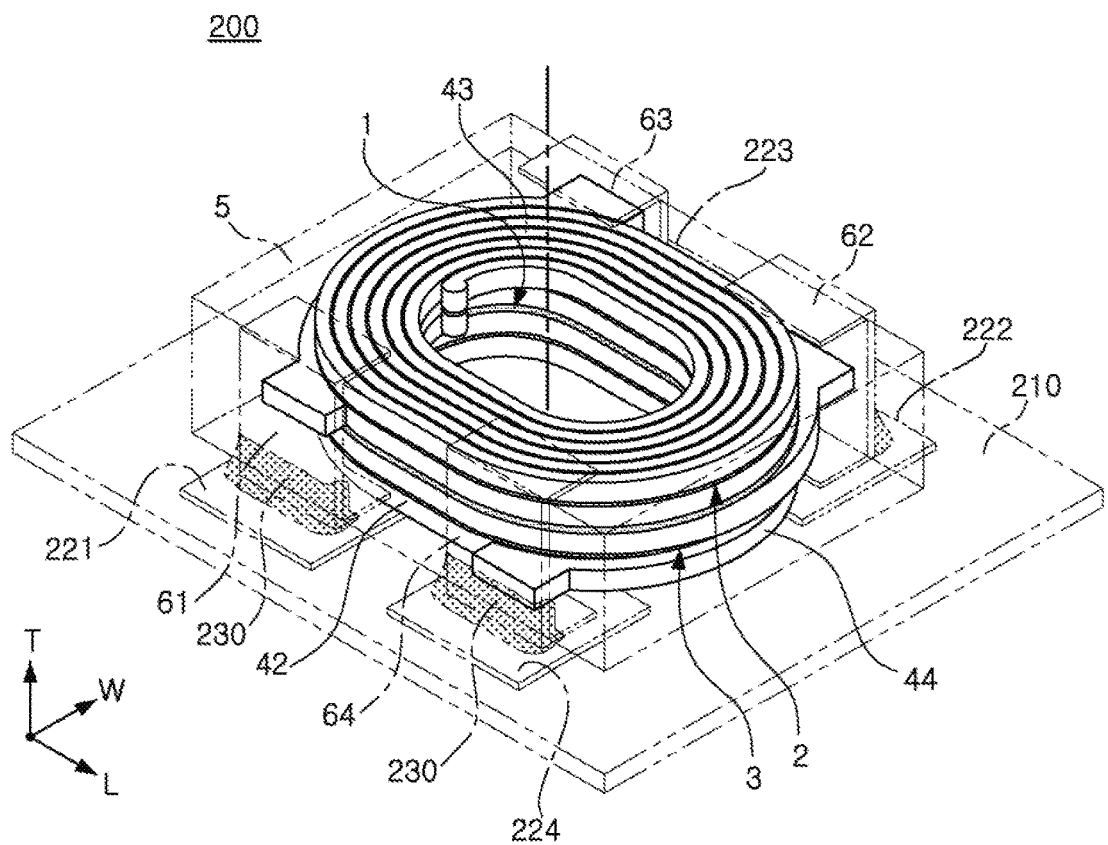
FIG. 3 is a perspective view illustrating an exemplary embodiment in which the coil component of FIG. 1 is mounted on a board.

FIG. 3 is a schematic perspective view illustrating an embodiment in which the coil component of FIG. 1 is mounted on a board.

Referring to FIG. 3, a board 200 having a coil component according to an exemplary embodiment in the present disclosure may include a substrate 210 on which the coil component 100 is mounted, and a plurality of electrode pads 221, 222, 223 and 224 formed on an upper surface of the substrate 210 to be spaced apart from each other.

The first to fourth external electrodes 41, 42, 43 and 44 of the coil component may be electrically connected to the substrate 210 by a solder 230 in a state in which the first to fourth external electrodes 41 to 44 are respectively disposed on the electrode pads 221, 222, 223 and 224 to be in contact with each other.

Except for the above-mentioned description, a description of characteristics overlapping those of the coil component according to the exemplary embodiment described above will be omitted.

As set forth above, according to the exemplary embodiments in the present disclosure, the coil component having structurally sufficient hardness, and the board having the same, may be provided.

According to an exemplary embodiment, by increasing a height of the coil to a width thereof while preventing an occurrence of a short between the coils, the coil component having the coil structure of the high aspect ratio (AR), and the board having the same, may be provided.

According to an exemplary embodiment, the coil component capable of improving inductance within a predetermined volume, and the board having the same, may be provided.

While exemplary embodiments have been shown and described above, it will be apparent to those skilled in the art that modifications and variations could be made without departing from the scope of the present invention as defined by the appended claims.

What is claimed is:

1. A coil component comprising:
a main substrate;
a first coil pattern disposed on a first surface of the main substrate;
a first insulating layer disposed on one surface of the first coil pattern;
a third coil pattern disposed on one surface of the first insulating layer and electrically connected to the first coil pattern;
a second coil pattern disposed on a second surface of the main substrate opposing the first surface;
a second insulating layer disposed on one surface of the second coil pattern;
a fourth coil pattern disposed on one surface of the second insulating layer and electrically connected to the second coil pattern; and
a magnetic body in which the first to fourth coil patterns are embedded.

2. The coil component of claim 1, wherein the first coil pattern is spaced apart from the second coil pattern by the same interval as a thickness of the main substrate, and
the first coil pattern is physically disconnected from the second coil pattern by the main substrate.

3. The coil component of claim 1, wherein the first coil pattern is electrically connected to the third coil pattern by a via penetrating through the first insulating layer, and
the second coil pattern is electrically connected to the fourth coil pattern by a via penetrating through the second insulating layer.

4. The coil component of claim 1, wherein the main substrate has a thickness greater than that of the first insulating layer.

5. The coil component of claim 1, wherein the main substrate has a thickness greater than that of the second insulating layer.

6. The coil component of claim 1, wherein the first insulating layer has the same thickness as that of the second insulating layer.

7. The coil component of claim 1, wherein the first and second coil patterns are isotropic plated layers.

8. The coil component of claim 1, wherein the third and fourth coil patterns are anisotropic plated layers.

9. The coil component of claim 1, further comprising first, second, third and fourth external electrodes,
wherein the first coil pattern is electrically connected to the first external electrode, and the third coil pattern is electrically connected to the third external electrode,
the second coil pattern is electrically connected to the second external electrode, and the fourth coil pattern is electrically connected to the fourth external electrode, and
the first and second external electrodes are input terminals, and the third and fourth external electrodes are output terminals.

10. The coil component of claim 1, wherein the main substrate is an insulating substrate.

11. The coil component of claim 1, wherein the first and second insulating layers include a metal based soft magnetic substrate.

12. A coil component comprising:
a main substrate;
a first coil pattern disposed on a first surface of the main substrate;

a first insulating layer disposed on one surface of the first coil pattern;

a third coil pattern disposed on one surface of the first insulating layer and electrically connected to the first coil pattern;

a second coil pattern disposed on a second surface of the main substrate opposing the first surface;

a second insulating layer disposed on one surface of the second coil pattern;

a fourth coil pattern disposed on one surface of the second insulating layer and electrically connected to the second coil pattern; and a magnetic body embedding the first to fourth coil patterns, wherein a thickness of the main substrate differs from thicknesses of the first and second insulating layers.

13. The coil component of claim 12, wherein the thickness of the main substrate is greater than the thickness of the first insulating layer.

14. The coil component of claim 12, wherein the thickness of the main substrate is greater than the thickness of the second insulating layer.

15. A board having a coil component, the board comprising:

a substrate having a plurality of electrode pads formed thereon; and a coil component installed on the substrate, wherein the coil component includes a main substrate, a first coil pattern disposed on a first surface of the main substrate, a first insulating layer disposed on one surface of the first coil pattern, a third coil pattern disposed on one surface of the first insulating layer and electrically connected to the first coil pattern, a second coil pattern disposed on a second surface of the main substrate opposing the first surface, a second insulating layer disposed on one surface of the second coil pattern, a fourth coil pattern disposed on one surface of the second insulating layer and electrically connected to the second coil pattern, and a magnetic body in which the first to fourth coil patterns are embedded.

16. The board of claim 15, wherein the first coil pattern is spaced apart from the second coil pattern by the same interval as a thickness of the main substrate, and the first coil pattern is physically disconnected from the second coil pattern by the main substrate.

17. The board of claim 15, wherein the first coil pattern is connected to the third coil pattern by a via penetrating through the first insulating layer, the second coil pattern is connected to the fourth coil pattern by a via penetrating through the second insulating layer, the first insulating layer has a thickness smaller than that of the main substrate, and the second insulating layer has a thickness smaller than that of the main substrate.

18. The board of claim 15, wherein the first and second coil patterns are isotropic plated layers, and the third and fourth coil patterns are anisotropic plated layers.

19. A method of manufacturing a coil component, comprising steps of:

forming first and second coil patterns on first and second sides of a main substrate, respectively;

forming first and second insulating layers on the first and second coil patterns, respectively;

forming third and fourth coil patterns on the first and second insulating layers, respectively; and forming a magnetic body embedding the first to fourth coil layers, the first and third coil patterns are electrically connected to each other;

the second and fourth coil patterns are electrically connected to each other; and a thickness of the main substrate differs from thicknesses of the first and second insulating layers.

20. The method of manufacturing a coil component according to claim 19, wherein the thickness of the main substrate is greater than the thicknesses of the first and second insulating layers.

\* \* \* \* \*